United States Patent [19]

Ibrahim et al.

[11] Patent Number: 4,772,761
[45] Date of Patent: Sep. 20, 1988

[54] SEALED ELECTRICAL COMPONENTS AND METHOD OF MAKING SAME

[75] Inventors: Emad K. Ibrahim; Edwin M. Smolin, both of York; Carolyn E. Solbrig, Harrisburg, all of Pa.

[73] Assignee: AMP Incorporated, Harrisburg, Pa.

[21] Appl. No.: 46,480

[22] Filed: May 4, 1987

[51] Int. Cl.$^4$ ............................................. H01H 9/02
[52] U.S. Cl. ................. 174/52 FP; 29/841; 200/293
[58] Field of Search .............. 174/52 FP, 52 PE; 357/72, 74; 200/293, 302.1, 5 R; 29/841, 855

[56] References Cited

U.S. PATENT DOCUMENTS

| | | | |
|---|---|---|---|
| 3,036,992 | 5/1962 | Holub et al. | 428/379 |
| 3,875,103 | 4/1975 | Leslie | 524/84 |
| 3,960,811 | 6/1976 | Bennett et al. | 528/495 |
| 4,009,149 | 2/1977 | King et al. | 528/219 |
| 4,417,106 | 11/1983 | Gingerich et al. | 200/5 R |
| 4,446,294 | 5/1984 | Rose et al. | 528/128 |
| 4,451,610 | 5/1984 | Collister | 525/19 |
| 4,531,030 | 7/1985 | Gingerich et al. | 200/68.2 |
| 4,559,388 | 12/1985 | Liu et al. | 525/146 |
| 4,600,971 | 7/1986 | Rose et al. | 361/421 |
| 4,611,262 | 9/1986 | Galloway et al. | 361/426 |
| 4,684,684 | 8/1987 | Abe et al. | 524/227 |

FOREIGN PATENT DOCUMENTS

| | | |
|---|---|---|
| 0081929 | 6/1983 | European Pat. Off. |
| 0188152 | 7/1986 | European Pat. Off. |
| 3603912 | 8/1986 | Fed. Rep. of Germany |
| 1498439 | 1/1978 | United Kingdom |
| 2149576 | 6/1985 | United Kingdom |

OTHER PUBLICATIONS

DuPont Engineering Polymers "RYNITE" ® Thermoplastic Polyester Resin.
Radel A-400 Polyarylsulfone Union Carbide, "A Thermoplastic Engineered for High Performance in a Harsh Environment".
Engineering Polymers, Union Carbide, "ARDEL Polyarylate-The Tough Weatherable Thermoplastic".
General Electric Polyetherimide Properties Guide "ULTEM" ®.
ICI Victrex Pes–"Properties and Introduction to Processing".

Primary Examiner—Arthur T. Grimley
Assistant Examiner—David A. Tone
Attorney, Agent, or Firm—Katherine A. Nelson

[57] ABSTRACT

An electrical component (20) comprises electrical circuit means (22) and housing member (50) disposed over a first portion (24) of the electrical circuit means (22). The circuit means (22) has a second portion (30) extending outwardly from the housing member (50) at a junction (32) with the first portion (24). The housing member (50) comprising a dielectric amorphous thermoplastic resin which is molded over the first portion (24) of the electrical circuit means (22). The composition seals the interface (56) of the housing (50) and the extending second portion (30) of the circuit means (22) and maintains sealing engagement therewith when stress is applied to the interface (56).

20 Claims, 7 Drawing Sheets

SEALED ELECTRICAL COMPONENTS AND METHOD OF MAKING SAME

FIELD OF THE INVENTION

This invention relates to electrical components and more particularly to sealed electrical components and a method for making same.

BACKGROUND OF THE INVENTION

An increasing number of electronic components are used on printed circuit boards and the like. A large number of these are being miniaturized such that the electrical contact members are smaller and more closely spaced. Since the majority of these components are soldered to circuit boards, and then cleaned in an aqueous or solvent cleaning process, there is an increasing need to have the components sealed to prevent solder, fluxes, cleaning solvents, and moisture from entering the components and causing malfunctions. These components must have assemblies that will not be affected by the soldering temperatures and cleaning conditions required during the manufacturing process.

In addition, the electrical contacts of such components are often subjected to stress both during and after manufacture. The components are often made by molding a dielectric composition over a prestamped electrical circuit means by insert molding and other methods as known in the art. The electrical circuit means have a plurality of electrical contact members, at least a portion of which extend outwardly from the overmolded housing and form an interface with that housing. The electrical contact members may then be subject to additional stress by subsequent forming of the extended contact members, other manufacturing steps and inserting the component onto a circuit board or other mounting surfaces. It is desirable that the seal at the interfaces be able to withstand insertion forces exerted by automatic insertion equipment.

U.S. Pat. Nos. 4,417,106; 4,531,030; 4,600,971 and 4,611,262 disclose typical components wherein the electrical contacts must remain sealed at the interface of the metal contact members with the housing despite stress being applied to the contact members during forming, other manufacturing steps, and insertion into circuit board or other substrate.

U.S. Pat. Nos. 4,417,106 and 4,531,030 disclose DIP switches comprised of a sealed electrical contact assembly and contact-actuating mechanisms latchably secured thereto. The contact assembly is comprised of a dielectric frame molded over a plurality of electrical contact members. The contact members have electrical terminal sections which extend outwardly and downwardly from the frame. U.S. Pat. Nos. 4,600,971 and 4,611,262 disclose electrical circuit packages comprised of dielectric housing members molded onto lead frames. The housing members in these patents include a plurality of openings therein for receiving and interconnecting leaded and leadless components respectively with contact sections of the lead frame.

When making electrical components such as those described above, it is desirable that sealing engagement be maintained at the interface or joint between the molded housing and the extending electrical circuit means even when the extended circuit means are subject to stress induced by forming or insertion forces. It is desirable that the sealing engagement be maintained when the component is subjected to the high temperatures associated with soldering. It is also desirable that the sealing engagement at such interfaces be resistant to solder, fluxes and solvents to prevent such from being wicked into the molded housing and contaminating or damaging the contact area.

While crystalline or semicrystalline molding materials may be used to form the housing members of the components, it has been found that the housing does not completely seal around the metal circuit members or will develop microcracks or separate at the metal/housing interface when the components are subjected to stress at the joints or interfaces of the housing and circuit members. These stress induced separations permit entrance of solder, flux, cleaning solvents and the like into the contact area, which could render the component electrically useless. Generally, stress induced microcracks are not readily discernable upon visual inspection. Heretofore, effective sealing has been achieved by the use of thermoset materials as the dielectric housing members. Since these materials must be cured for a period of time prior to removal from a mold, the mold cycle time is relatively long compared to that required for thermoplastic materials. It is desirable, therefore, to use materials that will allow shorter cycle time.

SUMMARY OF THE INVENTION

Accordingly, it is an object of the present invention to provide improved sealed electrical components wherein stress cracks of the housing at the interface with circuit members extending therefrom, are essentially eliminated even when the circuit members are subjected to stress subsequent to molding the housing.

It is a further object of the invention to provide an electrical component having a sealed interface between the housing and circuit members the dielectric housing that is resistant to solder, fluxes, solvents and the like.

It is also an object of the invention to use a thermoplastic material that will allow shorter mold cycle times.

It is an additional object of the invention to provide a method of making moisture resistant sealed electrical components.

It is a feature of this invention to have an electrical component wherein the housing is molded from a dielectric material, that permits portions of the circuit members extending from the housing to be bent or otherwise subjected to stress without inducing stress cracks in the housing. The material, therefore, is especially suitable for use in overmolding lead frames.

Another advantage of the invention is that overmolded lead frames or the like can be manufactured in continuous strip form by molding methods known in the art. The presently preferred method is by injection molding. As can be discerned, the nature of the parts of the electrical components of this type lend themselves to automatic assembly practices.

According to the present invention an electrical component is comprised of an electrical circuit means and housing means disposed over a first portion of the circuit means. The circuit means includes at least a second portion extending outwardly from the housing means at a junction with the first portion. The housing means comprises a dielectric composition molded over the first portion of the electrical circuit means. The composition of an amorphous thermoplastic composition, which seals the housing means around the first portion of the electrical circuit means and maintains sealing engagement therewith at the interface of the housing and metal, when stress is applied to the joint.

In the preferred embodiment the electrical circuit means comprises a lead frame stamped from metal. After the housing means has been molded, the outwardly extending second portions of the circuit means are formed to the desired configuration.

In accordance with the invention, in one embodiment, a sealed component may be used as a part of an electrical connector assembly. In other embodiments of a sealed component, leaded and leadless electrical devices are mounted to the housing members.

In accordance with further teachings of the invention, there is described herein an improved method for assembling a sealed electrical component.

Further advantages and specific details of the invention will become apparent hereinafter, by way of example, in the following detailed description of the preferred embodiments taken in conjunction with the drawings.

DETAILED DESCRIPTION OF THE PREFERRED EMBODIMENT

Figure 1:
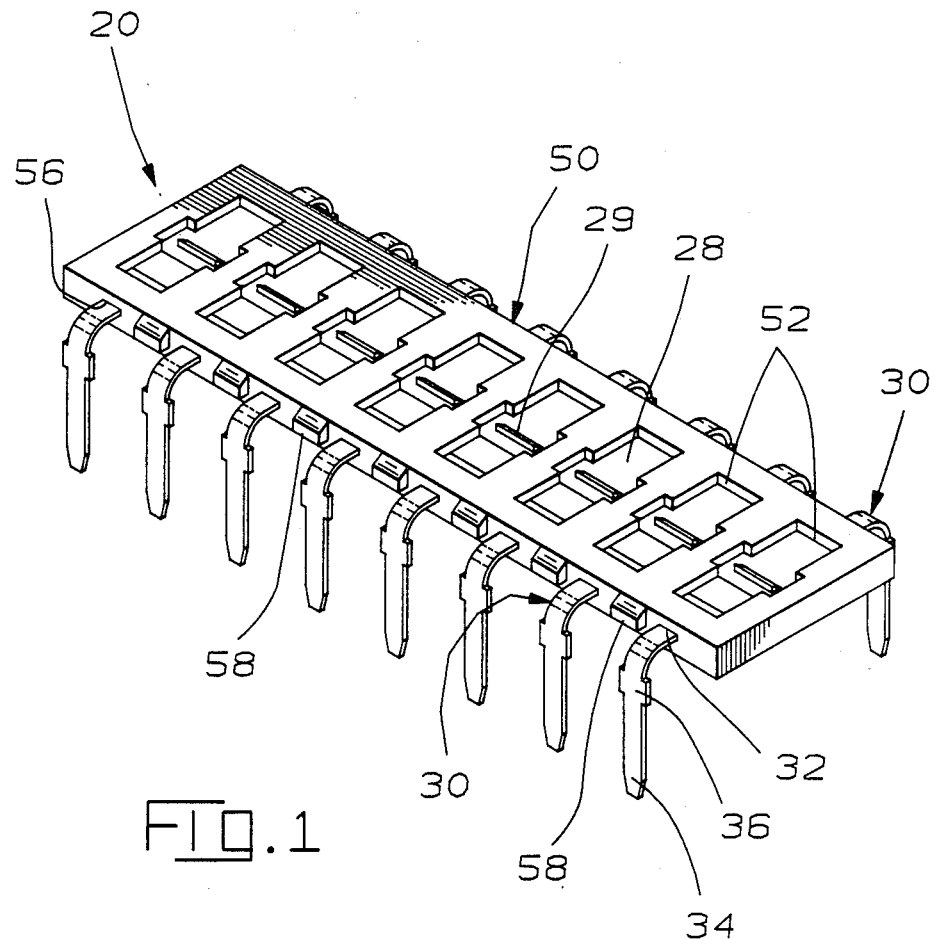
FIG. 1 is a perspective view of an assembled electrical component made in accordance with the invention.
Figure 2:
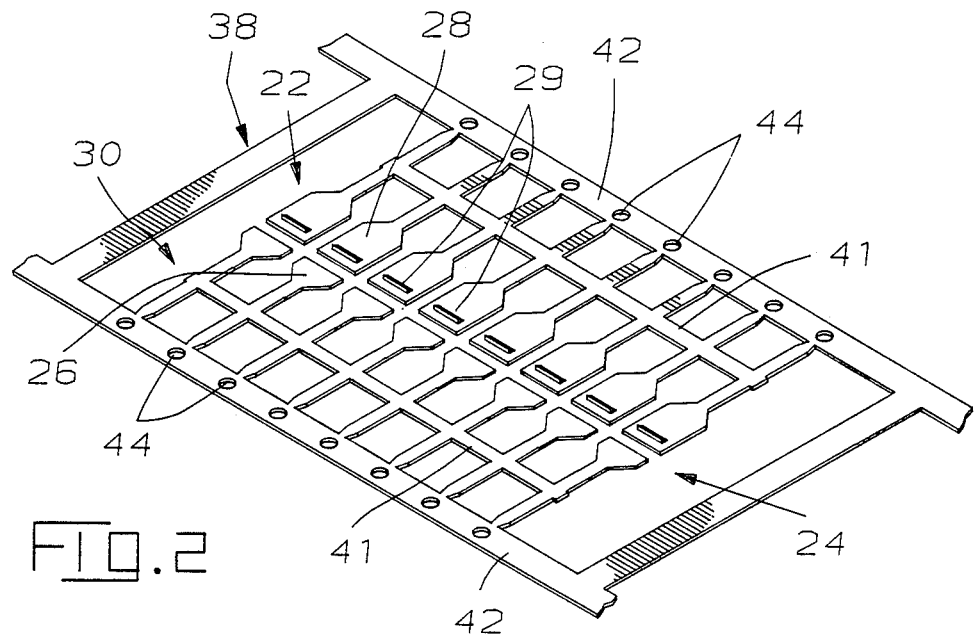
FIG. 2 is a perspective view of a strip of electrical circuit means used in the electrical component in FIG. 1.
Figure 3:
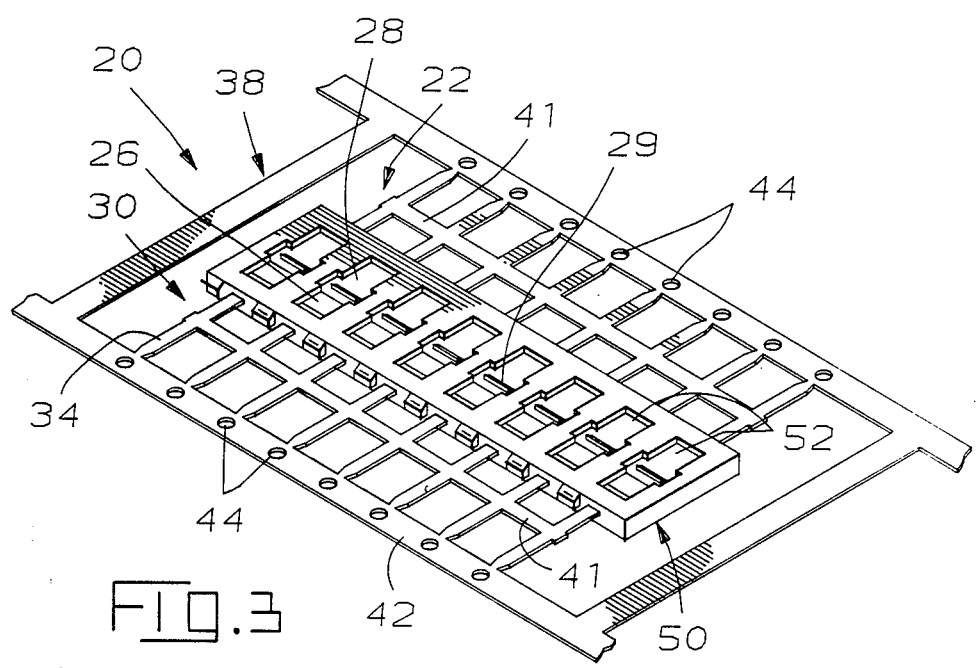
FIG. 3 is a perspective view of the housing overmolded on the electrical circuit means of FIG. 2.
Figure 4:
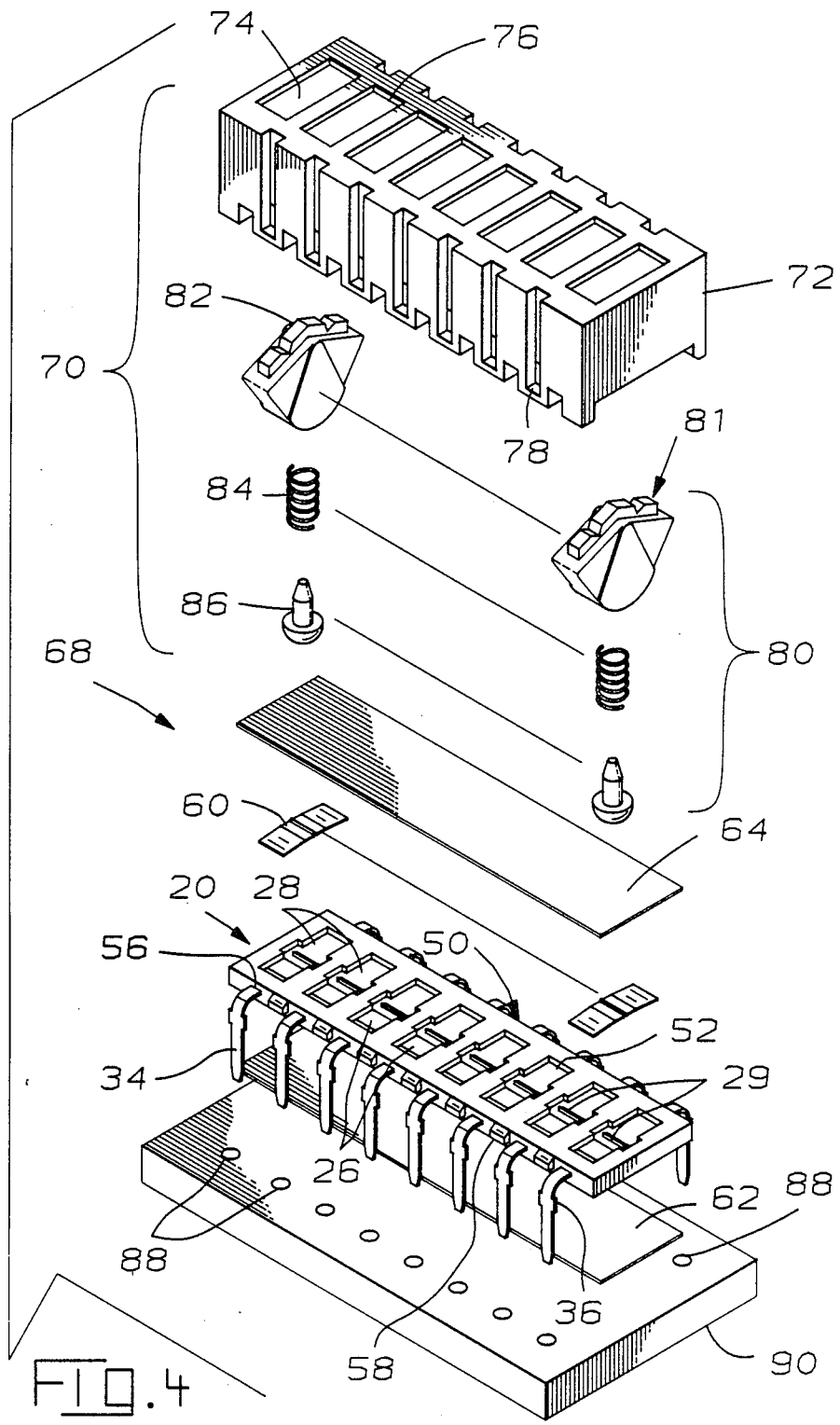
FIGS. 4 and 5 are exploded views of electrical connectors which incorporate the electrical component of FIG. 1.
Figure 5:
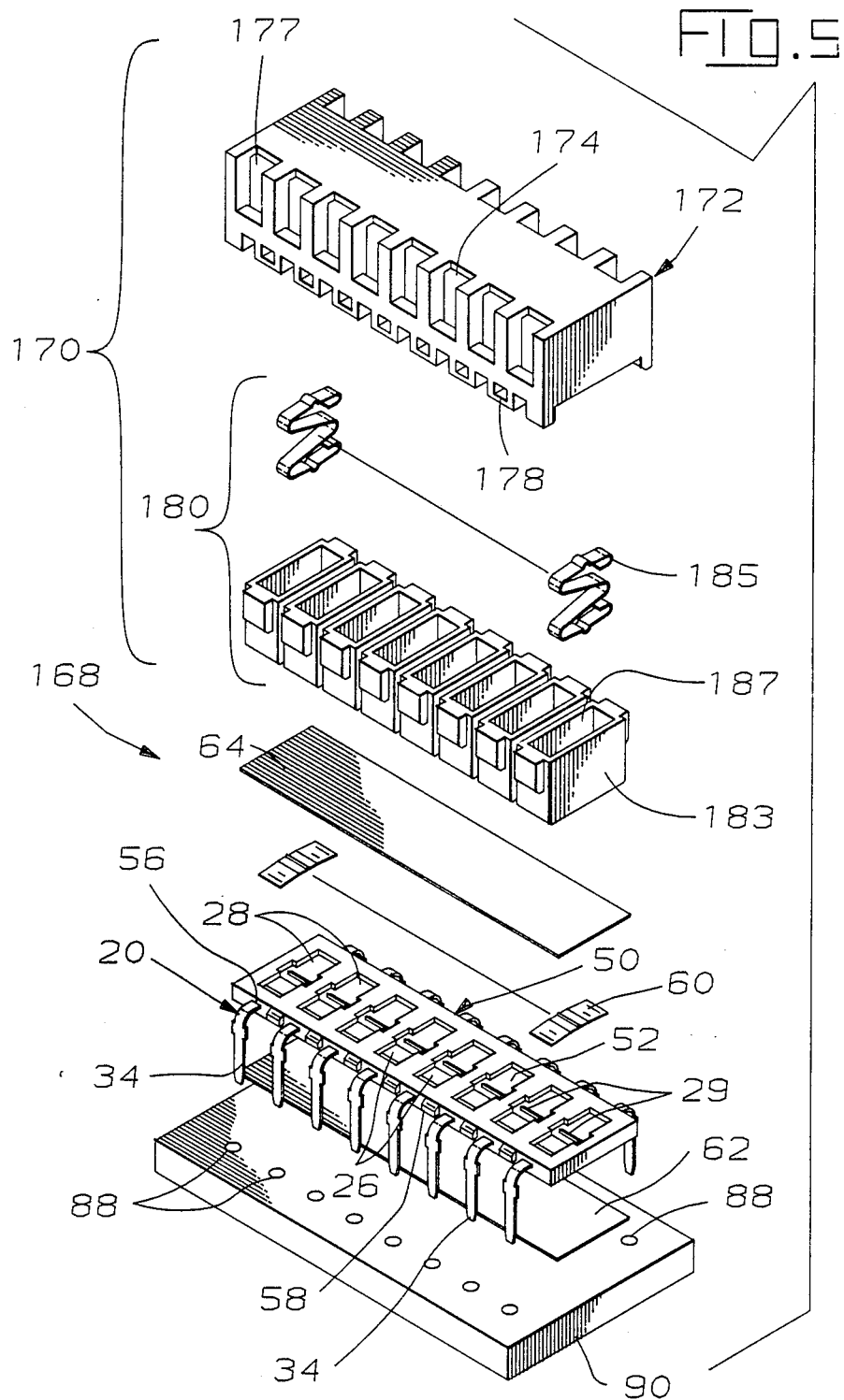

FIGS. 1 to 3 illustrate the sealed electrical component 20 comprised of an electrical circuit means 22 and a dielectric housing 50 disposed over first portion 24 of electrical circuit means 22. Electrical circuit means 22 further has a second portion 30 which extends outwardly from housing 50 at a junction 32 with first electrical circuit portion 24. First electrical circuit portion 24 includes opposed first and second contact sections 26, 28 respectively. Second contact section 28 has a pivot member 29 embossed thereon. First and second contact sections 26, 28 may be plated with gold or other metals. Second electrical circuit portion 30 has electrical terminal sections 34 thereon which are designed to be engaged in holes on a circuit board as best seen in FIGS. 4 and 5 wherein sealed electrical component 20 forms part of DIP switches 68, 168 mounted on circuit boards 90. Second electrical circuit portion 30 further includes projections 36 on terminal sections 34. Projections 36 space the electrical component 20 from the surface of the circuit board 90 as best seen in FIGS. 4 and 5.

Dielectric housing 50 is molded onto electrical circuit means 22, preferably by injection molding as known in the art. Housing 50 has a plurality of recesses 52 therein, in which are exposed the opposed first and second contact sections 26 and 28. Housing 50 is sealed to the metal circuit means 22 along the edges of recess 52 as well as at the interface 56 of housing 50 with the second electrical circuit portion 30. Housing 50 further includes a plurality of latching means 58 for engaging contact actuating mechanisms 70, 170, as shown in FIGS. 4 and 5, respectively.

FIGS. 1 to 3 also illustrate the method of making sealed electrical component 20. Electrical circuit means 22 are stamped and formed from suitable metal such as, for example, brass or the like, in the form of a lead frame as illustrated in FIG. 2 with terminal sections 34 being connected together by strip 41 and connected at their ends to carrier strips 42. Only one set of carrier strips 42 having lead frame 38 therein is shown, but the carrier strips 42 are preferably continuous strips of stamped and formed lead frames 38. Carrier strips 42 provide means for carrying the lead frames through stamping, plating and other manufacturing steps of making the sealed electrical component 20. Carrier strips 42 have a plurality of holes 44 therein, which provide the means for aligning lead frames 38 and for moving the strip of frames 38 through the manufacturing process.

In accordance with the invention, dielectric housing 50 is molded from an amorphous thermoplastic resin. It has been found that housings made from amorphous thermoplastic resins will form seals at the interfaces of the housing and any extending metal members that are far superior to those found between metal contact members and housings made from crystalline or semicrystalline materials. The amorphous thermoplastic resin seals surprisingly well to plated metals. The amorphous thermoplastic resins furthermore maintain sealing engagement at the interfaces when contact members are stressed by further forming the metal members subsequent to molding the housings or by insertion into a circuit board, preferably by automatic insertion equipment. In addition, the interface of metal and housing remains in sealing engagement when the components are subjected to soldering temperatures, which generally reach about 500°0 F. (260° C.) and during subsequent cleaning in an aqueous or solvent cleaning process.

The durability of the seals at the housing/metal interface of components made in accordance with this invention is essentially equivalent to that previously obtainable with thermoset materials. That such durability could be achieved by two classes of materials with such divergent properties as those of amorphous thermoplastic resins and thermoset resins, was both surprising and unexpected.

It is believed that the random coil structure of the molded amorphous resins can better accommodate different thermal stresses and better absorb shocks than can the more rigid structures of molded crystalline or semicrystalline resins, which may be uniaxially oriented.

It is further believed that the lower flexural modulii of molded amorphous resins as compared to that of molded crystalline or semicrystalline resins and high impact resistance exhibited by amorphous resins contributes to the ability to retain sealing engagement under the stresses imposed on the article by the manufacturing process and subsequent use. It is presently believed that the flexure modulus of the amorphous thermoplastic resin should be between 300,000 and 700,000 psi (2.1-4.8 GPa).

In general, the amorphous resins suitable for use in accordance with this invention should produce molded articles that have a sufficiently high glass transition temperature and heat deflection temperature to avoid deformation and dimensional changes during the soldering process. The molded articles should also be resistant to damage from solder, fluxes and chemicals used to clean the parts such as aqueous detergents and cleaning solvents. In addition, the material used for molding should be flame retardant. Preferably parts molded from an amorphous resin should exhibit a uniform amount of shrinkage in all directions and exhibit no substantial dimensional changes when subjected to the high temperature ranges normally associated with the manufacturing process and in particular to soldering temperatures. The viscosity of the amorphous resin should be within the desired range associated with the particular method of molding to achieve filling of the mold cavities without adversely affecting the impact and solvent resistance and heat and distortion resistance of the molded part.

The preferred method for forming housing 50 in the embodiment of FIGS. 1 through 5 is injection molding, since it generally requires a lower cycle time than other molding processes such as those involved with thermoset materials. Suitable amorphous resins for housing 50 are polyethersulphones, polyetherimides and polyarylates. Suitable polyethersulphones are available from Imperial Chemical Industries (ICI) under the trade name "VICTREX PES". Suitable polyetherimide resins are available from General Electric Company under the trade name "ULTEM"ʳ resin. Suitable polyarylates are available from Union Carbide Corporation under the trade name "ARDEL". The amorphous thermoplastic resins used in the presently preferred embodiment are unfilled. It is to be understood, however, that some filled amorphous resins may be suitable for some applications.

Parts were molded from amorphous resins using a DEMAG Model 85 conventional injection molding machine. In molding parts it was found that it was important not to overpack the mold cavities in order to effect a good seal at the metal and housing interface. Generally the injection pressure used was the minimum required to obtain a full shot into all the mold cavities at a maximum injection speed. Pressure was then reduced to minimize overpacking and to allow the parts to solidify and shrink around the metal. For example, polyethersulphone cores were molded in a center gated eight cavity mold by injecting the melt (heated to 680°–690° F., 360°–365° C.) under 1300–1500 psi (9–10.4 MPa) into a mold heated to 230°–260° F. (110°–126° C.). Typical injection times were 0.15–0.30 seconds. The pressure was then reduced to 400–500 psi (2.8–3.5 MPa) for 2–3 seconds. The resin was allowed to cool for about 19–22 seconds before molded cores were removed from the mold. It is to be understood that cycle time, mold temperatures, injection pressures and times will vary according to the parts being molded as well as the site of the mold, molding equipment and resin used.

Electrical component 20 is designed to be used in DIP switches such as those shown in FIGS. 4 and 5. Depending upon the method used to manufacture such switches, the additional parts of the DIP switch may be attached to component 20 while it is still attached to carrier strips 42 or the terminals 34 may be severed from carrier strips 42, formed and shaped as shown in FIG. 1 and then assembled into the switches shown in FIGS. 4 and 5.

FIGS. 4 and 5 illustrate the construction of two styles of DIP switches 68 and 168. The assembly of switches 68, 168 of FIGS. 4 and 5 are completely disclosed in U.S. Pat. Nos. 4,417,106 and 4,531,030, respectively, the disclosures of which are incorporated by reference herein.

In the examples shown first and second contact sections 26, 28 form stationary contact section members for the switch 68, 168. The switches further include movable contact members 60 which are disposed above respective stationary contact section 26, 28. It is important that the assembly comprised of component 20 and movable contact members 60 be sealed to prevent solder, fluxes, solvents or the like from entering the assembly and causing malfunctions. Membrane layers 62 and 64, which are of commercially available plastic material, are sealingly secured, therefore, on the bottom and top surfaces respectively of housing 50 by commercially available adhesive material. The membrane 64 covers all of recesses 52 with movable contact members 60 pivotally mounted on pivot members 29 of contact 28. Membrane 62 is used to cover any holes (not shown) on the lower surface of housing 50 which may be left by the use of back up pins during the molding process. Alternatively, housing 50 can be molded without holes on the lower surface thus eliminating the need for the lower membrane layer. Furthermore, it has been found that when the housing is molded in accordance with the present invention, the seal between the housing at the location of back up pin holes at the interface with first contact portion is so complete, the lower membrane layer can also be eliminated even when the holes are present.

Referring now to FIG. 4, contact actuating mechanism 70 of switch 68 is comprised of a housing 72, and contact actuating members 80 comprising rocker members 81 spring members 84 and button members 86. Housing 72 has a plurality of cavities 74 therein for receiving the contact actuating members 80 and latching means 78 which cooperate with latching means 58 on electrical component 20 to secure switch 68 together. Cavities 74 further include openings 76 in the top surface of housing 72 for providing access to actuating members 80.

Rocker members 81 have projections 82 on the top surface thereof which extend through openings 76 and are actuated by a probe to move the rocker members from one contact position to the other. Rocker members 81 further include cavities (not shown) for receiving spring members 84 and buttons 86.

Referring now to FIG. 5, in switch 168 electrical component 20 is sealed in the same manner as previously described. The contact actuating mechanism 170 is comprised of housing 172 and contact actuating member 180 comprised of a plurality of slide members 183 and spring members 185. In this embodiment spring members 185 are mounted in cavities 187 of respective slide members 183. Housing 172 includes cavities 174 for receiving contact actuating members 180, the cavities having openings 177 on the sides of housing 172. Housing 172 further includes a latching means 178 for engaging the latching means 58 on component 20. In this embodiment slide members 183 are moved linearly from one position to the other to engage or disengage the switch.

FIGS. 6 through 9 disclose two embodiments of other electrical components wherein dielectric housing members are disposed on portions of lead frames. The electrical contact sections of these electrical devices are subject to bending or stress after the housing has been formed. The amorphous thermoplastic resin is particularly suited for molding to such lead frames. The dielectric material adheres and sealingly engages with the portions of the electrical contacts which extend from the housing member. Thus, the components may be exposed to moisture or solvents and subjected to stress by forming or other such means without breaking the sealing engagement. The components shown in these figures are completely disclosed in U.S. Pat. Nos. 4,600,971 and 4,611,262, respectively.

It is to be understood that these embodiments are representative examples of the types of components which can be made in accordance with the invention. Other components such as DIP packages and other moisture, solvent and heat resistant components can also be molded from amorphous thermoplastic resins.

Figure 6:
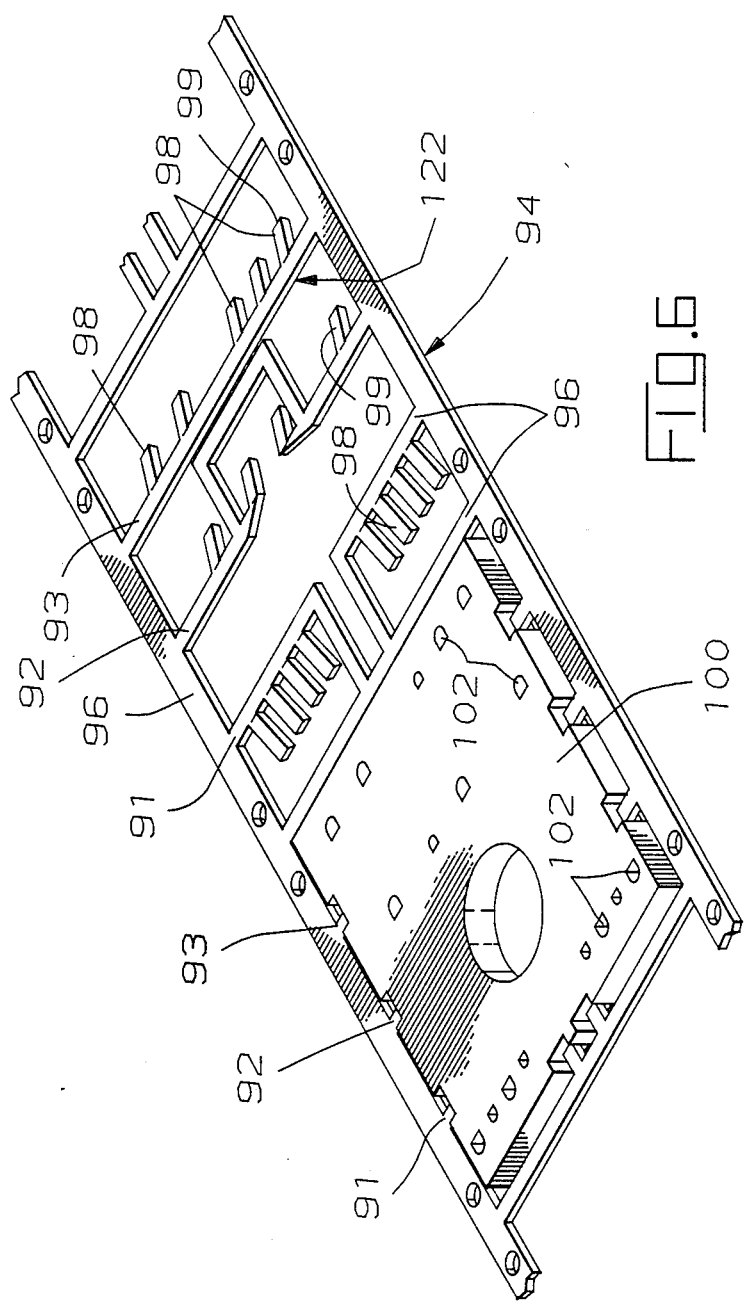
FIGS. 6 and 7 are perspective views illustrating the steps in making another embodiment of an electrical component in accordance with the invention.
Figure 7:
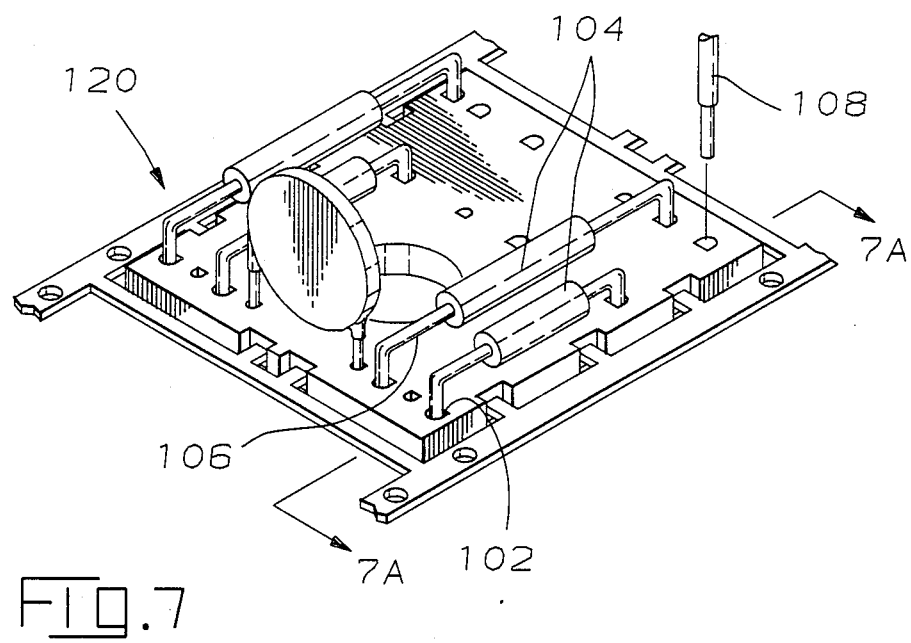
Figure 7A:
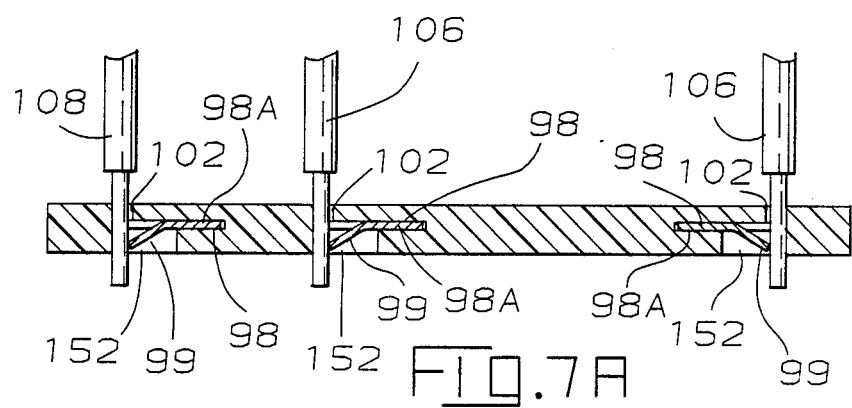
FIG. 7A is a cross-sectional view taken along the line 7A—7A of FIG. 7.

FIGS. 6, 7 and 7a disclose an electrical component 120 comprised of a lead frame 94 and a dielectric housing 100 molded in accordance with the invention. Lead frame 94 includes a plurality of spaced metal strips 91, 92, 83 extending between carrier members 96, and a plurality of projections 98 extend outwardly from strips 91, 92 and 93. Projections 98 are comprised of first and second portions 98A and 99 respectively, first portion 98A being essentially embedded in the housing 100 with second portion 99 extending outwardly from housing 100 at a junction with first portion 98A. As best seen in FIG. 7A, housing 100 includes recesses 152 on one surface which expose second portions 99 of respective projections 98 and a plurality of holes 102 extending through the housing 100 and in communication with respective exposed projected second portions 99. Leads 106 of leaded electrical devices 104 and electrical wires 108 can be inserted into the holes 102 in electrical engagement with second portions 99 of the projections and secured therein by second portions 99 of the projections 98.

Figure 8:
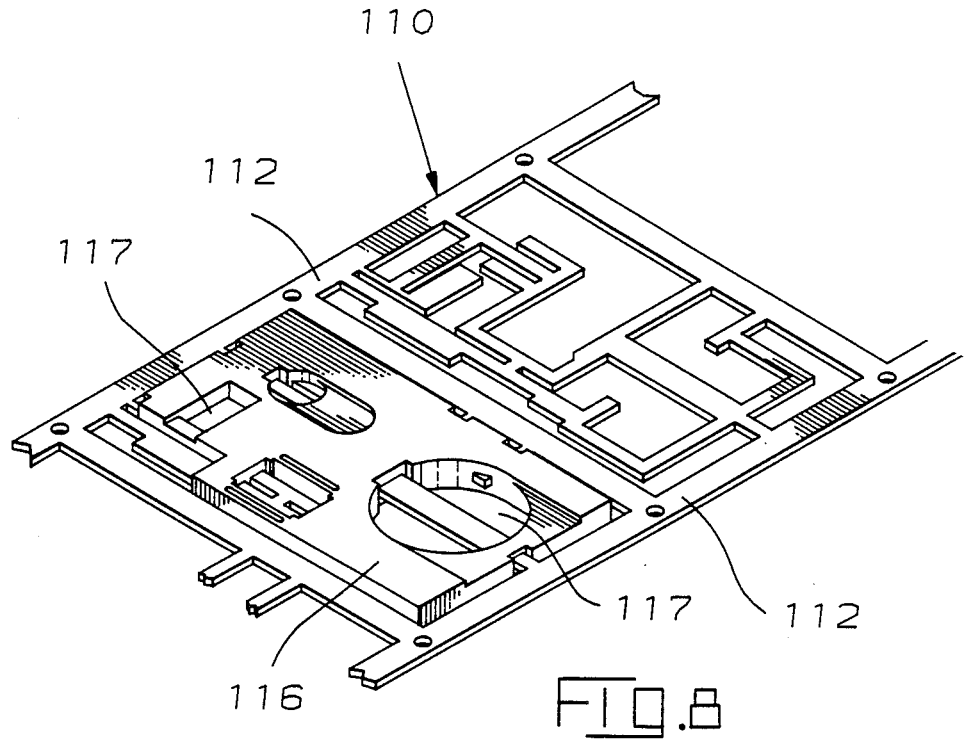
FIGS. 8 and 9 are perspective views illustrating the steps in making a further embodiment of an electrical component in accordance with the invention.
Figure 9:
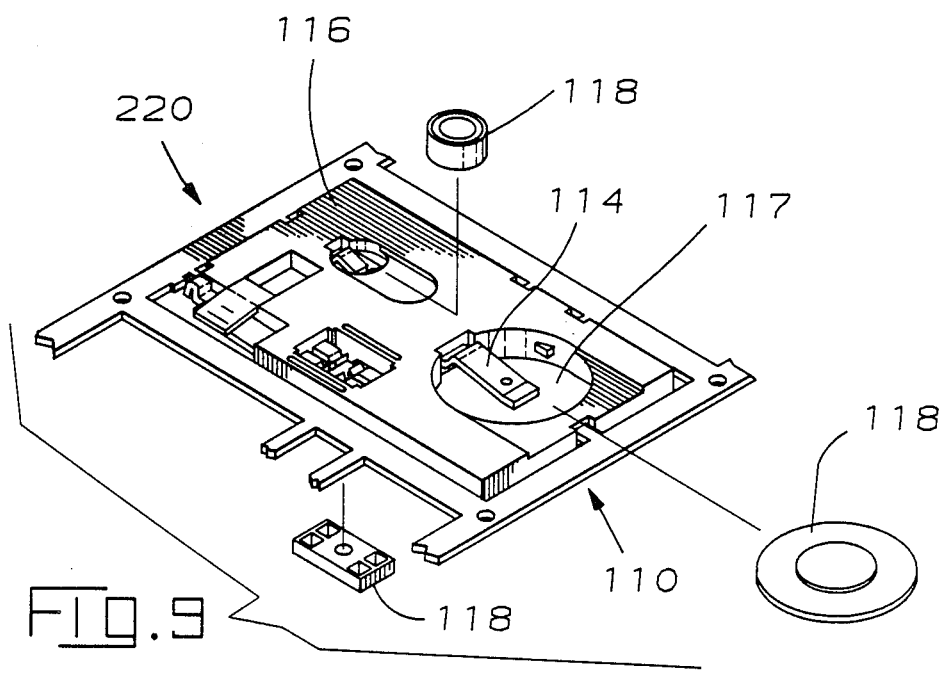

FIGS. 8 and 9 disclose a further electrical component 220 comprising a stamped and formed lead frame 110 on which is molded a dielectric housing 116 in accordance with the invention. Housing member 116 has a plurality of openings 117 having exposed electrical contacts 114 therein. A plurality of leadless electrical devices 118 are mounted into the respective exposed contacts 114 in the openings 117 of housing 116.

As can be discerned from the above discussion, the nature of the parts of the electrical components disclosed herein lends itself to automatic assembly practices that enables the rate of manufacture of such components to be substantially increased. The lead frames may be stamped in a progressive die in a continuous strip and then subjected to a molding operation on a continuous basis to mold the dielectric housing to the lead frame so that the molded assembly comes out of the mold in a continuous strip. This molded assembly can be wound onto reel for further processing or preferably can continue in an automatic assembly operation wherein other parts of an electrical connector, such as for a DIP switch, or the leaded or leadless components are added to the housings, prior to severing the completed component from the strip.

In the manufacturing of the DIP switches shown in FIGS. 4 and 5, the contact terminals cannot be formed until after they have been severed from the lead frames. It is advantageous, therefore, to assemble as much of the switch as possible in a continuous operation prior to severing the terminals from the strip. Since the amorphous thermoplastic resin seals the interface between the housing and metal and does not crack upon applying stress to those terminals during forming or insertion, the entire assembly can be automated for cost effective manufacturing. When manufacturing the electrical components for circuit packages of the embodiment shown in FIGS. 6 through 7a, contact members are bent at the time the various electrical devices or wires are inserted into the holes of the dielectric housing member thus subjecting the projections to stress. In the case of the circuit package shown in FIGS. 8 and 9, the contacts are formed to their desired position prior to attaching the leadless devices.

The following tests were performed on assembled DIP switches having sealed components, hereinafter referred to as cores, made in accordance with the present invention. In some of the samples a Kapton tape was applied to both the upper and lower surfaces of component 20 to seal the recesses and back-up pin openings. In other samples the lower tape layer was omitted. The results of these tests and a comparison with results of tests of DIP switches made with crystalline or semicrystalline materials are given in Tables 1 and 2. The tests clearly demonstrate the unusual and surprising results obtained when an amorphous rather than a crystalline thermoplastic resin is used to mold the core of the DIP switch.

Vacuum Test

The purpose of this test was to test the efficiacy of the seals at the interface of the housing and metal of the cores. This test was conducted using DYKEM Layout Dye Red DX-296, available from Dykem Company, St. Louis, Mo. Completely assembled switches having 8 positions per switch, were completely immersed in a DYKEM Dye solution. The switches in the dye solution were placed in a vacuum oven which was evacuated to 28 mm of mercury at ambient temperature. The oven was allowed to return to atmospheric pressure. The switches were removed from the dye solution and allowed to dry at room temperature for approximately 20 minutes. The switches were then disassembled to remove the sealed electrical component or core subassembly. The tape was removed from the upper surface to expose the contact area. The area was visually inspected to determine whether the red dye entered through the interface or under the seal formed by the tape. A switch was considered to pass if no dye was visible in the contact area of any of the positions. The results of this test are given in Table 1.

Leak test

The purpose of this test was to determine whether the interfaces of the core housing and metal contacts remained sealed when the switches were wave soldered to a printed circuit board and subsequently cleaned. A circuit board having through holes for receiving the electrical terminals but no conductive traces was used for the tests. This allowed the tested switches to be removed and examined without having to "desolder" the terminals.

The switches were mounted to the board using a standard insertion machine or a simulation thereof. The board with the connectors mounted thereto was subjected to standard wave soldering procedures which included foam fluxing, preheating and wave soldering with standard equipment. The board with the switches mounted thereon was cleaned with water in a standard batch cleaning process as known in the art. The switches were removed from the board, disassembled and the cores were examined for flux or water under the tape at 20× magnification. A switch was considered to have passed if there was no layer of moisture (indicating a tape leak) or large drops of water under the tape. Very small droplettes of moisture in the corners of the switch indicating condensation were considered acceptable. The results of this test are given in Table 1.

Contact resistance test

The purpose of this test was to determine the effect of the shock of machine insertion and soldering conditions on the seal at the housing/metal interface on the contact resistance of each switch position of a switch. Failure of the seal at the interface allowed flux and/or moisture to enter the contact area, thus increasing the resistance of the circuit. The initial contact resistance was measured across each switch position (8 positions per switch) of a number of switches with a dry circuit milliohmmeter. The switches were then inserted into a circuit board, prepared in the same manner as the one described for the Leak Test, using a standard insertion-machine or simulation thereof. The circuit board was run through standard wave soldering procedures with standard equipment. The board was then cleaned with water in a batch aqueous cleaning system and heated in an oven for 20 minutes at 220° F. (104° C.). The contact resistance across each switch position was again read with a dry circuit milliohmmeter and compared with the initial reading for that switch. Switches were considered to pass this test if the initial contact resistance of all 8 positions the switch was 50 milliohms or less and the final contact resistance of all 8 positions was 100 milliohms or less. The results of these tests are given in Table 2.

TABLE 1

| Test | Number of Samples | Core Material | Type[a] | Taping Top Surface | Taping Both Surfaces | Pass | Fail |
|---|---|---|---|---|---|---|---|
| VACUUM | 1 | polyethylene terephthalate[b] | C | X | | | 1 |
| | 5 | polyethylene terephthalate[b] | C | | X | | 5 |
| | 6 | polyethersulphone[c] | A | X | | 6 | |
| | 9 | polyethersulphone[c] | A | | X | 9 | |
| LEAK | 10 | polyethersulphone[b] | A | X | | 9 | 1[d] |
| | 10 | polyethersulphone[b] | A | | X | | |
| | 20 | polyetherimide[e] | A | | | 11 | 7[d] |

[a]C designates crystalline/semicrystalline resins, A designates amorphous resins.
[b]Samples were molded from formulations of RYNITE resins available from E. I. DuPont de Nemours & Co.
[c]Samples were molded from formulations of VICTREX resins available from Imperial Chemical Industries.
[d]Leak caused by failure of the tape to seal.
[e]Samples were molded from formulations of ULTEM resins available from General Electric Company.

TABLE 2

Contact Resistance Test[a] (milliohms)

| | Number of Switches | Core Material | Type[b] | Taping Top | Taping Both | Min. | Max. | Mean | Standard Deviation | Pass | Fail |
|---|---|---|---|---|---|---|---|---|---|---|---|
| 1. | 167[c] | polyethylene terephthalate | C | X | | | | | | 81 | 86[d] |
| 2. | 38 | polyethylene terephthalate | C | | X | | | | | 30[e] | 8 |
| 3. | 6 | polyethersulphone | A | X | | 9 | 19 | 13 | | 6 | 0 |
| 4. | 6 | polyethersulphone | A | | X | 10 | 26 | 13 | | 6 | 0 |
| 5. | 50[f] | polyethersulphone | A | | X | 11.4 | 27.5 | 14.8 | 2.42 | all | 0 |
| 6. | 10[g] | polyethersulphone | A | X | | 13.09 | 34.69 | 17.01 | 3.44 | 10 | 0 |
| 7. | 10[h] | polyethersulphone | A | X | | 10.74 | 37.31 | 19.3 | 7.25 | 10 | 0 |

[a]Except where noted, each switch was measured at all 8 positions. To pass, all positions had to be in the acceptable range. Except where noted, switches were inserted into circuit boards under conditions that simulated production equipment and conditions.
[b]C designates crystalline/semicrystalline resins, A designates amorphous resins.
[c]Mounted with production equipment.
[d]70% had contact resistances greater than 300 mohms.
[e]11 switches had contact resistance between 50 and 100 mohms.
[f]100 readings randomly selected from a possible 400.
[g]Initial readings after insertion but before wave soldering.
[h]Readings of same switches as 6 after insertion, wave soldering and cleaning.

As can be seen from the above tables, cores molded from amorphous thermoplastic resins (amorphous cores) far outperformed those molded from crystalline resin (crystalline cores). In the vacuum test all of the cores molded from crystalline material exhibited red dye in one or more contact area per switch. The contact resistance tests clearly demonstrate that even when crystalline cores molded withstood forming and automatic insertion forces, over half of them failed when subjected to wave soldering.

In the leak test, eight of the amorphous cores tested had inadequate tape seals, (see 64 in FIGS. 4 and 5) which admitted water to the complete contact area. It was impossible, therefore, to determine if any water had entered the seal at the interface of the metal and housing.

In the drawings and specification, there have been set forth presently preferred embodiments of the invention, and although specific terms are employed, they are used in a generic and descriptive sense only and not for purposes of limitations. It will be apparent that various changes may be made in the form, construction and arrangement of the parts thereof without departing from the spirit or scope of the invention or sacrificing all its material advantages.

We claim:

1. An electrical component comprising:
   electrical circuit means and housing means disposed over a first portion of said electrical circuit means, said circuit means having at least a second portion extending outwardly from said housing means at a junction with said first portion;
   said housing means comprising a dielectric composition molded over said first portion of said electrical circuit means, said composition being an amorphous thermoplastic resin whereby said housing means seals around said first portion of said electrical circuit means and maintains sealing engagement therewith at said junction with said second portion upon stress being applied to said junction.

2. The electrical component as described in claim 1 wherein said amorphous thermoplastic resin is selected such that the housing means molded therefrom has a sufficiently high enough glass transition temperature to avoid deformation and dimensional changes when subjected to soldering temperatures and conditions.

3. The electrical component as described in claim 1 wherein said amorphous thermoplastic resin is selected such that the housing means molded therefrom is essentially resistant to heat and solvents.

4. The electrical component as described in claim 1 wherein said amorphous thermoplastic resin is selected such that the housing means molded therefrom has an essentially uniform rate of shrinkage when molded and essentially uniform dimensional changes when exposed to heat.

5. The electrical component as described in claim 1 wherein said amorphous thermoplastic is selected from the group consisting of polyethersulphones and polyetherimides and polyarylates.

6. The electrical component as described in claim 1 where said amorphous thermoplastics are selected such that the housing means molded therefrom are flame retardant.

7. The electrical component as described in claim 1 wherein said second portion of said electrical circuit means comprises a plurality of electrical terminal members, said terminal members being formed to extend essentially at right angles to said first portion of said electrical circuit means.

8. The electrical component as described in claim 1 wherein said electrical circuit means is a lead frame.

9. The electrical component as described in claim 8 wherein said lead frame is serially connected to other lead frames having other housing means disposed thereon, to form a strip of serially connected electrical components.

10. The electrical component as described in claim 1 wherein said housing means includes a plurality of recesses therein, a section of said first portion of said electrical circuit means being exposed in said recesses such that second electrical circuit means may be electrically interconnected to said sections of said first portions of said electrical circuit means, said housing means being in sealing engagement with said first electrical circuit portions at said recesses.

11. The electrical component as described in claim 1 wherein said housing means includes a plurality of apertures extending therethrough and said second portions of said electrical circuit means extend into said apertures.

12. The electrical component as described in claim 11 wherein at least one leaded electrical device is mounted to said electrical component, the leads of said device extending through said apertures and being in electrical engagement with said second circuit portions.

13. The electrical component as described in claim 11 wherein at least one leadless electrical device is mounted in one of said apertures of said electrical component, such that said device of electrically connected to said second circuit portion extending into said one of said apertures.

14. An electrical connector having as a part thereof, at least one of said electrical components as described in claim 1.

15. An electrical switch comprising:
    electrical circuit means;
    first housing means disposed over a first portion of said electrical circuit means, said electrical circuit means having at least a second portion extending outwardly from said first housing means at a joint with said first portion, said first housing means comprising a dielectric composition molded over said first portion of said electrical circuit means and in sealing engagement with said first portion at said joint, said composition being an amorphous thermoplastic resin;
    a plurality of recesses in said housing means, at least one of said recesses having exposed sections of said first electrical circuit portions therein, said composition being in sealing engagement with said first circuit portions at said aperture, said exposed sections comprising stationary opposed sets of electric contact means for said switch;
    movable electrical contact means;
    second housing means securable to said first housing means; and
    contact operating means mounted within said second housing means including: means for moving said movable electrical contact means between a first position for electrically connecting said opposed sets of stationary contact means and a second position for electrically disconnecting said opposed sets of stationary contact members.

16. A method for making an electrical component comprising the steps of:
    providing an electrical circuit means;
    selecting an amorphous thermoplastic resin; and
    molding said selected amorphous thermoplastic resin to form housing means over a first portion of said electrical circuit means, such that a second portion of said electrical circuit means extend outwardly at a joint with said first portion;
    whereby said housing means seals around said first portion of said electrical circuit means and maintains sealing engagement therewith at said joint with said second portion upon stress being applied to said joint.

17. The method for making an electrical component as described in claim 16 wherein said amorphous thermoplastic resin is selected such that the housing means molded therefrom has a sufficiently high enough glass transition temperature to avoid deformation and dimensional changes when subjected to soldering temperatures and conditions.

18. The method for making an electrical component as described in claim 16 wherein said amorphous thermoplastic resin is selected such that the housing means molded therefrom has an essentially uniform rate of shrinkage when molded and essentially uniform dimensional changes when exposed to heat.

19. The method for making an electrical component as described in claim 16 wherein said amorphous thermoplastic is selected from the group consisting of polyethersulphones and polyetherimides, and polyarylates.

20. The method for making an electrical component as described in claim 16 wherein said electrical circuit means comprises continuous strip of serially connected lead frame members and said method further includes the step of forming a strip of serially connected electrical components.

* * * * *